(12) United States Patent
Yamamoto et al.

(10) Patent No.: US 7,159,309 B2
(45) Date of Patent: Jan. 9, 2007

(54) METHOD OF MOUNTING ELECTRONIC COMPONENT ON SUBSTRATE WITHOUT GENERATION OF VOIDS IN BONDING MATERIAL

(75) Inventors: Tsuyoshi Yamamoto, Kawasaki (JP); Mitsuo Suehiro, Kawasaki (JP); Hiroshi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 587 days.

(21) Appl. No.: 10/073,106

(22) Filed: Feb. 12, 2002

(65) Prior Publication Data

US 2003/0051905 A1    Mar. 20, 2003

(30) Foreign Application Priority Data

Sep. 19, 2001    (JP)    ............... 2001-284886

(51) Int. Cl.
  *H05K 3/30*    (2006.01)
(52) U.S. Cl. ............... 29/832; 29/840; 29/841; 29/844; 29/846; 29/851; 29/854; 156/64; 156/356; 156/357; 156/358; 174/259; 174/260; 228/180.22; 228/227; 257/686; 257/778; 438/103; 438/106; 438/112; 438/118; 438/119; 438/127
(58) Field of Classification Search ............... 29/831, 29/832, 840, 841, 844, 846, 851, 854; 156/64, 156/356, 357, 358; 228/175, 227, 180.22; 174/259, 260; 361/770, 804; 257/686, 778; 438/103, 106, 112, 118, 119, 127
See application file for complete search history.

(56) References Cited

U.S. PATENT DOCUMENTS 5,629,566 A * 5/1997 Doi et al. ............ 257/789
5,722,160 A * 3/1998 Uemura et al. ............ 29/840
5,878,942 A   3/1999 Kodama et al.
6,133,637 A * 10/2000 Hikita et al. ............ 257/777
6,209,196 B1 * 4/2001 Ozono et al. ............ 29/840
6,981,317 B1 * 1/2006 Nishida ............ 29/840

FOREIGN PATENT DOCUMENTS

JP   57188833 A * 11/1982
JP   9-92682        4/1997

OTHER PUBLICATIONS

"A fracture mechanics approach to thermal fatigue life prediction of solder joints"; Pao, Y.-H.;☐☐Components, Hybrids, and Manufacturing Technology, IEEE; Aug. 1992 pp. 559-570.*

* cited by examiner

*Primary Examiner*—Paul D. Kim
(74) *Attorney, Agent, or Firm*—Westerman, Hattori, Daniels & Adrian, LLP.

(57) ABSTRACT

When an electronic component is mounted on a substrate, the electronic component is first placed on the substrate with a solid support interposed between the electronic component and the substrate. The solid support serves to space a terminal conductor of the electronic component from a corresponding terminal pad on the substrate. A conductive bonding material is then melted on the terminal pad. The melted conductive bonding material gets exposed to the peripheral atmosphere over a larger area. Even if a bubble is generated within the melted conductive bonding material, the bubble is allowed to easily get out of the melted conductive bonding material. Removal of the gas is promoted in the melted conductive bonding material. The solid support is subsequently melted. The electronic component is moved down toward the substrate, thereby contacting the terminal conductor with the melted conductive bonding material on the corresponding terminal pad. Removal of the gas in this manner leads to improvement in the strength of bonding between the substrate and the electronic component.

4 Claims, 3 Drawing Sheets

METHOD OF MOUNTING ELECTRONIC COMPONENT ON SUBSTRATE WITHOUT GENERATION OF VOIDS IN BONDING MATERIAL

BACKGROUND OF THE INVENTION

1. Field of the Invention

The present invention relates to a method of mounting an electronic component, such as a ball grid array (BGA) semiconductor package. In particular, the invention relates to a method of mounting an electronic component on a substrate by melting a conductive bonding material on a terminal pad on the substrate.

2. Description of the Prior Art

Some methods of mounting an electronic component on a substrate utilize a solder paste. The solder paste is previously printed on terminal pads disposed on the surface of the substrate. Terminal conductors, such as solder balls, of the electronic component are placed on the corresponding terminal pads. After the electronic component has been set on the substrate in this manner, the substrate is passed through a reflow oven. Solder particles dispersed within the solder paste are caused to melt in the reflow oven. Subsequent cooling treatment serves to solidify the solder on the terminal pads on the substrate. The terminal conductors of the electronic component are thus bonded to the corresponding terminal pads on the substrate.

The solder paste usually includes an organic solvent. When the solder particles melt in the solder paste, the organic solvent is forced to vaporize in the melting solder. In this case, the vaporized or gaseous organic solvent is locked within the melting solder in the aforementioned conventional method, since the surface of the solder paste is covered with the terminal conductors of the electronic component. Voids remain within the solidified solder. The voids may cause a failure in electric contact between the electronic component and the substrate. The voids are supposed to reduce the strength of bonding between the electronic component and the substrate.

SUMMARY OF THE INVENTION

It is accordingly an object of the present invention to provide a method of mounting an electronic component on a substrate, which is capable of enhancing the reliability of bonding between the electronic component and the substrate.

According to a first aspect of the present invention, there is provided a method of mounting an electronic component on a substrate, comprising: placing the electronic component on the substrate with a solid support interposed between the electronic component and the substrate so as to space a terminal conductor of the electronic component from a corresponding terminal pad on the substrate; melting a conductive bonding material on the terminal pad; and thereafter melting the solid support so as to move down the electronic component toward the substrate, thereby contacting the terminal conductor with the conductive bonding material melting on the corresponding terminal pad.

The method enables a reliable prevention of contact between the conductive bonding material on the terminal pad and the terminal conductor when the conductive bonding material gets melted. The melted conductive bonding material gets exposed to the peripheral atmosphere over a larger area. Even if a bubble is generated within the melted conductive bonding material, the bubble is allowed to easily get out of the melted conductive bonding material. Removal of the gas is promoted in the melted conductive bonding material. Removal of the gas in this manner leads to improvement in the strength of bonding between the substrate and the electronic component. A solder paste may be supplied to the surface of the terminal pad in this method. The solder paste may comprise a flux including an organic solvent, for example, and solder particles as the conductive bonding materials dispersed in the flux. When the solder particles get melted, the organic solvent in the solder paste may get vaporized in the melted solder.

In this case, a solid support is employed to lift the electronic component above the substrate. The solid support of this type can simply be interposed between the substrate and the electronic component. The terminal conductor of the electronic component can easily be prevented from contacting the terminal pad on the substrate. Moreover, the terminal conductor is caused to fall or drop toward the terminal pad in response to melting of the solid support. Contact can be established between the terminal conductor and the terminal pad with a simple structure. The solid support may be made of a thermoplastic resin material having the melting point higher than that of the conductive bonding material. The solid support of this type provides an electronic circuit board comprising: a substrate; an electronic component mounted on a surface of the substrate and having a terminal conductor received on a terminal pad on the substrate; and a thermoplastic resin material interposed between the substrate and the electronic component.

According to a second aspect of the present invention, there is provided a method of mounting an electronic component on a substrate, comprising: melting a conductive bonding material on a terminal pad on the substrate under a high temperature atmosphere; and contacting a terminal conductor of the electronic component on the conductive bonding material on the terminal pad continuously under the high temperature atmosphere.

The conductive bonding material is allowed to get exposed to the peripheral atmosphere over a larger area. Even if a bubble is generated within the melted conductive bonding material, the bubble easily gets out of the melted conductive bonding material. The gas is reliably removed from the melted conductive bonding material. The terminal conductor of the electronic component can be placed on the terminal pad on the substrate after removal of the gas out of the melted conductive bonding material. Removal of the gas in this manner leads to improvement in the strength of bonding between the substrate and the electronic component. A solder paste may be supplied to the surface of the terminal pad in this method. The solder paste may comprise a flux including an organic solvent, for example, and solder particles as the conductive bonding materials dispersed in the flux. When the solder particles get melted, the organic solvent in the solder paste may get vaporized in the melted solder.

Moreover, the conductive bonding material is simply exposed under the high temperature atmosphere when the conductive bonding material is to be melted. Groups of the electronic components can simultaneously be mounted on one or more substrates. The productivity can be improved as compared with the case where the electronic components are separately or individually mounted on the substrate, or the mounting of the electronic components is separately or individually effected on the individual substrates.

The method may further comprise: placing the electronic component on the substrate, prior to melting of the conductive bonding material, with a solid support interposed between the electronic component and the substrate so as to space the terminal conductor from the terminal pad; and melting the solid support so as to move down the electronic component toward the substrate, thereby contacting the terminal conductor with the conductive bonding material on the corresponding terminal pad, when the terminal conductor is contacted on the terminal pad. In this case, the solid support may be made of a thermoplastic Be resin material having the melting point higher than that of the conductive bonding material.

According to a third aspect of the present invention, there is provided a method of mounting an electronic component on a substrate, comprising: melting a solder paste on a terminal pad on the substrate; and placing a terminal conductor of the electronic component on the solder paste on the terminal pad, said solder paste being kept melted.

The solder particles in the solder paste get melted in the melted solder paste. The solvent in the solder paste simultaneously gets vaporized. Since the terminal conductor of the electronic component is prevented from contacting the terminal pad on the substrate, the melted solder is allowed to get exposed to the peripheral atmosphere over a larger area. The gaseous or vaporized organic solvent easily gets out of the melted solder. The terminal conductor of the electronic component can be placed on the terminal pad on the substrate after removal of the gas out of the melted conductive bonding material. Generation of voids can be prevented in the solidified solder. Removal of the gas or the voids in this manner leads to improvement in the strength of bonding between the substrate and the electronic component.

The method may further comprise in the aforementioned manner: setting the electronic component on the substrate, prior to melting of the solder paste, with a solid support interposed between the electronic component and the substrate so as to space the terminal conductor from the terminal pad; and melting the solid support so as to move down the electronic component toward the substrate, thereby contacting the terminal conductor with the solder paste on the corresponding terminal pad, said solder paste being kept melted. In this case, the solid support may be made of a thermoplastic resin material having a melting point higher than that of the solder paste. The method likewise serves to provide an electronic circuit board comprising: a substrate; an electronic component mounted on a surface of the substrate and having a terminal conductor received on a terminal pad on the substrate; and a thermoplastic resin material interposed between the substrate and the electronic component.

In any event, the solid support may have an adherent property on its surface. The adherent property of the solid support may be utilized to stick the electronic component on the substrate. The electronic component can thus stably be positioned on the substrate even during transportation or displacement. The adherent property may be established based on the natural property of the material for the solid support or based on an adhesive provided on the surface of the solid support.

The solid support also may have a high heat conductivity. The solid support of this type leads to a promoted radiation of heat from the electronic component mounted on the substrate. The solid support may contain alumina ($Al_2O_3$) particles dispersed in a resin material.

In any of the aforementioned methods, there may be provided an electronic component unit comprising: a terminal conductor of a predetermined height standing on a surface opposed to a substrate; and a solid support standing on the surface, said solid support having a height larger than the predetermined height.

When the electronic component unit is set on the substrate, the solid support is naturally interposed between the electronic component and the substrate. The operator is not required to additionally insert the solid support before or after setting the electronic component on the substrate. The productivity can thus be improved.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
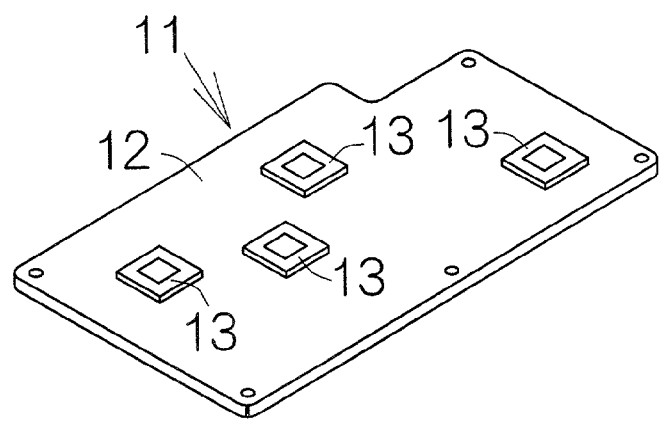
FIG. 1 is a perspective view illustrating an electronic circuit board.

FIG. 1 schematically illustrates the structure of a electronic circuit board 11. The electronic circuit board 11 includes a printed wiring board or substrate 12 of a resin material, for example, and one or more electronic components 13, such as ball grid array (BGA) semiconductor packages, mounted on the surface of the printed wiring board 12. An electrically conductive wiring pattern, not shown, spreads over the surface or/and interior of the printed wiring board 12 so as to establish electric connections between the BGA semiconductor packages 13, for example.

Figure 2:
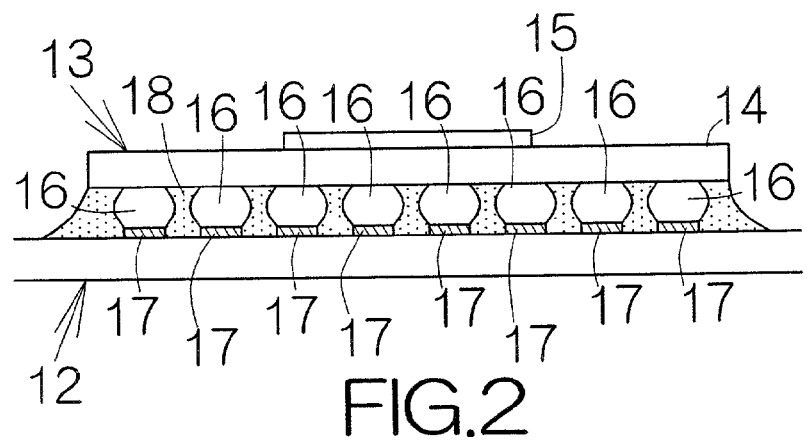
FIG. 2 is an enlarged vertical sectional view of the electronic circuit board for illustrating the structure of a ball grid array (BGA) semiconductor package in detail.

As shown in FIG. 2, the BGA semiconductor package 13 includes a semiconductor chip 15 mounted on the upper surface of a small-sized printed wiring board or substrate 14 of a ceramic material, for example. A plurality of connection terminals 16 are attached to the lower surface of the small-sized printed wiring board 14. The connection terminals 16 are received on corresponding terminal pads 17 on the printed wiring board 12. In this manner, electric connection can be established between terminal pads, not shown, of the small-sized printed wiring board 14 and the terminal pads 17 on the printed wiring board 12.

A so-called underfill 18 is interposed between the small-sized printed wiring board 14 of the BGA semiconductor package 13 and the printed wiring board 12. The underfill 18 may be made of a thermoplastic resin material, for example. The connection terminals 16 are embedded within the underfill 18. The underfill 18 serves to reinforce the strength of bonding between the BGA semiconductor package 13 and the printed wiring board 12. In addition, the underfill 18 reliably prevents the individual connection terminals 16 from getting exposed to the atmosphere, for example, so that corrosion or deterioration can be prevented in the connection terminals 16.

Figure 3:
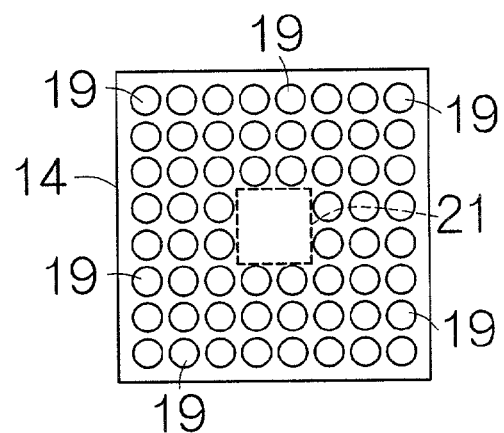
FIG. 3 is a plan view of the BGA semiconductor package for illustrating the array of solder balls.

Next, a detailed description will be made on a method of producing the electronic circuit board 11. The electronic components, namely, the BGA semiconductor packages 13 are first prepared. As shown in FIG. 3, a plurality of bumps or solder balls 19 of a predetermined array are attached on the back surface of the small-sized printed wiring board 14. It should be noted that a naked space 21 without any solder balls 19 is defined at a central area of the back surface of the small-sized printed wiring board 14. The back surface of the small-sized printed wiring board 14 is allowed to fully get exposed at the naked space 21 in the BGA semiconductor package 13.

Figure 4:
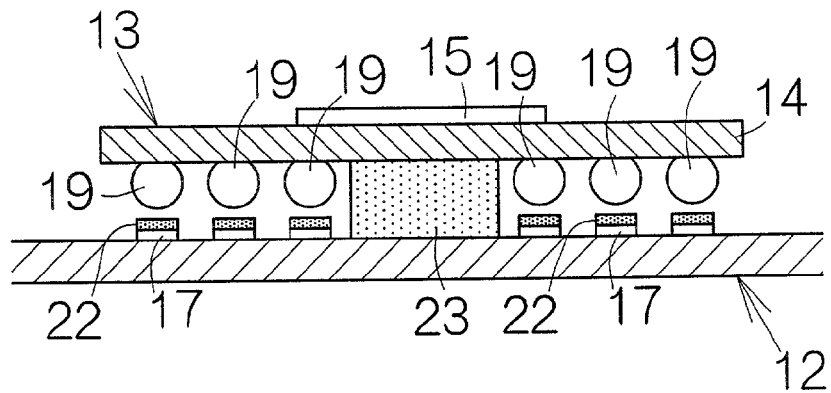
FIG. 4 is an enlarged partial section view of a printed wiring board for illustrating the process of placing the BGA semiconductor package on the printed wiring board.

As shown in FIG. 4, the BGA semiconductor package 13 is placed on the upper surface of the printed wiring board 12. The terminal pads 17 are formed on the upper surface of the printed wiring board 12. The terminal pads 17 are arranged in the corresponding array for the individual BGA semiconductor packages 13. A solder paste 22 is previously printed over the individual terminal pads 17. The solder paste 22 consists of a flux including an organic solvent, and a conductive bonding material, namely, solder particles dispersed in the flux.

A solid support 23 is interposed between the printed wiring board 12 and the BGA semiconductor package 13. The BGA semiconductor package 13 is received on the top surface of the solid support 23 at the naked space 21 of the small-sized printed wiring board 14. The solid support 23 serves to lift the BGA semiconductor package 13 above the surface of the printed wiring board 12. Specifically, the solid support 23 serves to space the solder balls 19 of the BGA semiconductor package 13 from the surface of the terminal pads 17. The individual solder balls 19 are prevented from contacting the solder paste 22 on the corresponding terminal pads 17.

Here, the melting point of the solid support 23 is set higher than that of the solder paste 22 or the solder particles. If the solder particles are made of an eutectic solder having the melting point of 183 degrees Celsius, for example, the solid support 23 may be made of a material having the melting point of approximately 200 degrees Celsius. The solid support 23 may be made of a thermoplastic resin material such as a polyurethane-based resin, a polyester-based resin, an acrylic-based resin, rosin, a polyamide-based resin, or the like. Alternatively, the solid support 23 may be made of a material other than the aforementioned resin material.

The solid support 23 preferably has an adherent property on its surface, for example. The adherent property of the solid support 23 may be utilized to stick the BGA semiconductor package 13 on the printed wiring board 12. The BGA semiconductor package 13 can thus stably be positioned on the printed wiring board 12 even during transportation or displacement. The adherent property may be established based on the natural property of the material for the solid support 23 or based on an adhesive provided on the surface of the solid support 23.

Figure 5:
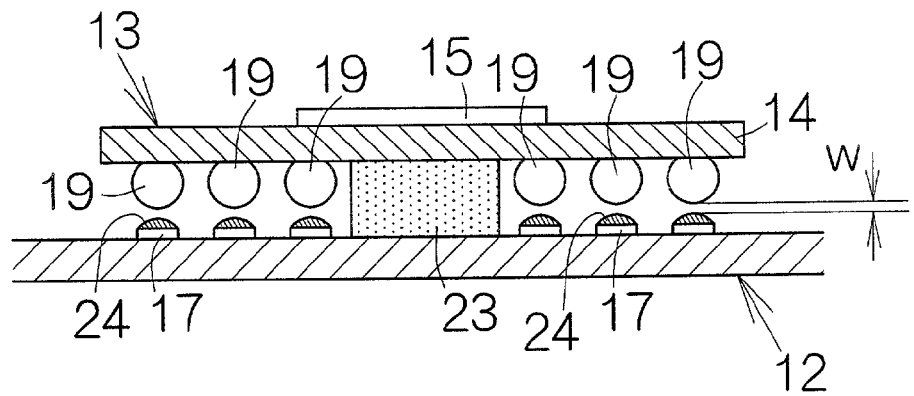
FIG. 5 is an enlarged partial section view of the printed wiring board for illustrating the process of generating melted solder on terminal pads on the printed wiring board.

Thereafter, a reflowing process is effected. The printed wiring board 12 is inserted into a reflow oven. A high temperature atmosphere of 220 degrees Celsius is maintained in the reflow oven. As shown in FIG. 5, the solder particles in the solder paste 22 are first allowed to melt on the surface of the terminal pads 17. The organic solvent simultaneously gets vaporized. The melted solder 24 remains on the surface of the terminal pads 17. The solder balls 19 of the BGA semiconductor package 13 also gets melted. The individual solder ball 19 maintains its spherical shape based on the surface tension.

In this situation, the temperature of the solid support 23 does not yet reach the melting point. Specifically, the solid support 23 keeps the solder balls 19 of the BGA semiconductor package 13 spaced from the melted solder 24 on the terminal pads 17 by a predetermined space w. The surface of the melted solder 24 gets exposed to the peripheral atmosphere. The vaporized or gaseous organic solvent in the solder paste 22 is allowed to easily get out of the melted solder 24. Removal of the gas can be promoted in the melted solder 24.

Figure 6:
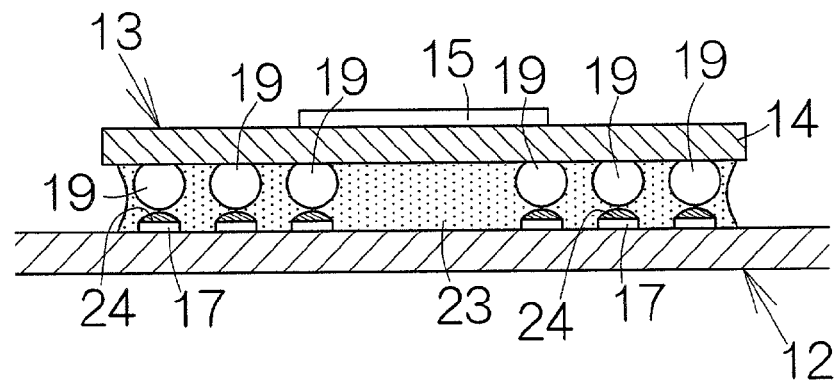
FIG. 6 is an enlarged partial section view of the printed wiring board for illustrating the process of melting a solid support between the printed wiring board and the BGA semiconductor package.

When the printed wiring board 12 is further maintained in the reflow oven, the temperature of the solid support 23 reaches the melting temperature. The solid support 23 gets melted. Specifically, the solid support 23 gets fluidized. The solid support 23 is thus removed below the BGA semiconductor package 13. The BGA semiconductor package 13 is allowed to drop toward the printed wiring board 12 based on its own weight. As shown in FIG. 6, the solder balls 19 are thus received on the corresponding terminal pads 17. The solder ball 19 gets unified with the melted solder 24 on the terminal pad 17. In this manner, the connection terminals 16 of the melted state can be established. When the gravity acting from the small-sized printed wiring board 14 to the connection terminals 16 is balanced with the overall surface tension of the connection terminals 16, the small-sized printed wiring board 14 stops falling or dropping.

The fluid of the solid support 23 spreads over the surface to the printed wiring board 12 between the connection terminals 16. The fluid fills the space defined between the printed wiring board 12 and the small-sized printed wiring board 14. The fluid remain within the space between the printed wiring board 12 and the small-sized printed wiring board 14 based on its own surface tension.

Thereafter, the printed wiring board 12 is taken out of the reflow oven. The printed wiring board 12 is subjected to a cooling treatment in the normal atmosphere or at a room temperature. The fluid gets solidified so as to provide the underfill 18 between the printed wiring board 12 and the small-sized printed wiring board 14. The connection terminals 16 subsequently get solidified. Electric connection can thus be obtained between the printed wiring board 12 and the small-sized printed wiring board 14. The mounting of the BGA semiconductor package 13 has been completed.

In particular, in the case where the BGA semiconductor packages 13 are to be mounted on the single printed wiring board 12, the printed wiring board 12 needs be exposed only once to the high temperature atmosphere in the aforementioned method. The BGA semiconductor packages 13 are simultaneously mounted on the printed wiring board 12. The productivity can be improved as compared with the case where the BGA semiconductor packages 13 are separately or individually mounted on the printed wiring board 12. The production time is also shortened. Moreover, a group of the printed wiring boards 12 may simultaneously be subjected to the high temperature atmosphere in the aforementioned method. The productivity can be improved as compared with the case where the mounting of the BGA semiconductor packages 13 is separately or individually effected on the individual printed wiring boards 12. The production time is still further shortened.

Figure 7:
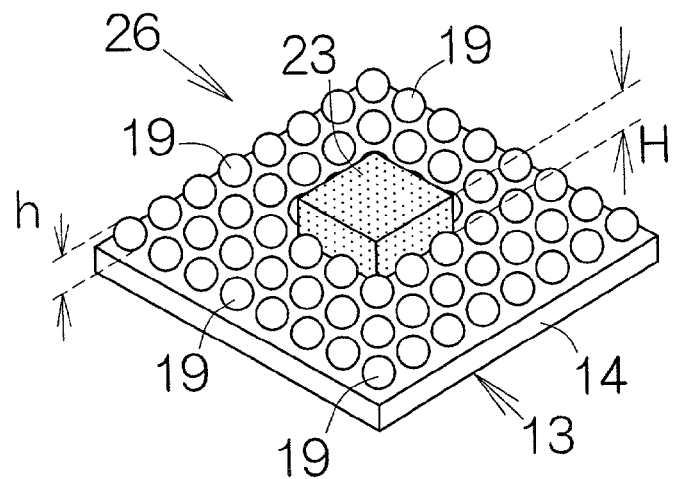
FIG. 7 is a perspective view schematically illustrating the structure of an electronic component unit.

As shown in FIG. 7, when the aforementioned method is to be realized, an electronic component unit 26 may be prepared. The electronic component unit 26 includes the BGA semiconductor package 13 and the solid support 23. The solid support 23 is previously attached to the small-sized printed wiring board 14 at the naked space 21. In this case, the solid support 23 should have the height H larger than the height h of the terminal conductors or solder balls 19 on the back surface of the small-sized printed wiring board 14. When the electronic component unit 26 of this type is placed on the printed wiring board 12, the solid support 23 can be interposed between the printed wiring board 12 and the small-sized printed wiring board 14 so as to space the solder balls 19 of the BGA semiconductor package 13 from the corresponding terminal pads 17 on the printed wiring board 12, as is apparent from reference to FIG. 4, for example.

The volume of the solid support 23 may be determined as follows:

[Expression 1]

$$As \cdot H \geq Ac \cdot g - Vt \cdot n \quad (1)$$

Here, the constant As represents the area of the bottom of the solid support 23. The constant Ac represents the area of the back surface of the small-sized printed wiring board 14. The constant g represents the space between the front surface of the printed wiring board 12 and the back surface of the small-sized printed wiring board 14 in the final electronic circuit board 11. The constant Vt represents the volume of the single solder ball 19. The constant n represents the number of the solder balls 19 interposed between the printed wiring board 12 and the small-sized printed wiring board 14. The space g may be set at approximately 60% of the height h of the solder balls 19, for example. The setting in this manner enables establishment of the underfill 18 based on the solid support 23 without any supplement of materials. It should be noted that the volume of the solid support 23 may be set smaller than the volume of the underfill 18.

In addition, the height H of the solid support 23 should be set as follows:

[Expression 2]

$$H > h + t + p \quad (2)$$

Here, the constant t represents the height of the solder paste on the surface of the terminal pad 17. The constant p represents the thickness of the terminal pad 17 superposed on the surface of the printed wiring board 12. The height t of the solder paste 22 may be determined as follows:

[Expression 3]

$$t = \sqrt[3]{\frac{3Vm}{\pi} + \sqrt{\left(\frac{3Vm}{\pi}\right)^2 + r^6}} + \sqrt[3]{\frac{3Vm}{\pi} - \sqrt{\left(\frac{3Vm}{\pi}\right)^2 + r^6}} \quad (3)$$

Here, the constant Vm represents the volume of the melted solder 24 existing on the terminal pad 17. The constant r represents the radius of the terminal pad 17. The volume Vm of the melted solder 24 may be determined as follows:

[Expression 4]

$$Vm = Vp \cdot m \quad (4)$$

Here, the constant Vp represents the volume of the solder paste 22 when printed. The constant m represents the content of the solder particles in the solder paste in the form of ratio in volume. The content m may be set at approximately 0.5, for example. The volume Vp of the solder paste 22 may be determined as follows:

[Expression 5]

$$Vp = \frac{D^2 \pi}{4} \cdot tm \cdot k \quad (5)$$

Here, the constant tm represents the thickness of a mask employed to print the solder paste 22. The constant D represents the diameter of the opening defined in the mask at a position corresponding to the terminal pad 17. The constant k represents the rate or percentage of filling of the solder paste 22 within the opening. The rate k of filling may be set approximately in a range between 60% and 80%, for example. In general, the height t of the solder paste 22 gets smaller than the thickness tm of the mask. It should be noted that the height t of the solder paste 22 may be replaced with the thickness tm of the mask in the aforementioned [Expression 2].

Figure 8:
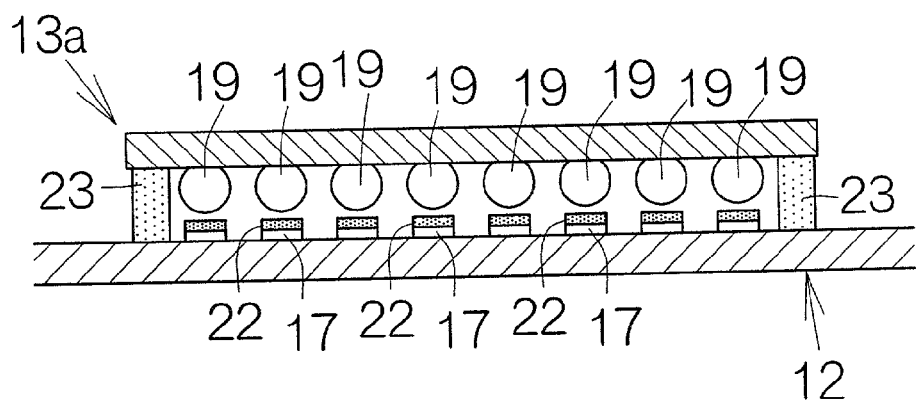
FIG. 8 is an enlarged partial section view of a printed wiring board for illustrating the process of placing a full matrix BGA semiconductor package on the printed wiring board.

The aforementioned method may be employed to mount a BGA semiconductor package 13a of a full matrix type. The solder balls 19 of the full matrix are arranged on the back surface of the small-sized printed wiring board in the full matrix BGA semiconductor package 13a. In order to realize the mounting of the full matrix BGA semiconductor package 13a on the printed wiring board 12, the solid support 23 may be provided in the form of a stud, as shown in FIG. 8, for example. The solid support 23 may be located on the individual corners of the small-sized printed wiring board 14.

The solder particles in the solder paste 22 is allowed to melt on the terminal pads 17 prior to melting of the solid supports 23. The organic solvent simultaneously gets vaporized. The melted solder is allowed to get exposed to the peripheral atmosphere over a larger area. Accordingly, the vaporized or gaseous organic solvent in the solder paste 22 is allowed to easily get out of the melted solder. Removal of the gas can be promoted in the melted solder. After solidification of the connection terminals 16, a thermosetting resin material underfill may be injected within the space between the printed wiring board 12 and the small-sized printed wiring board 14.

Figure 9:
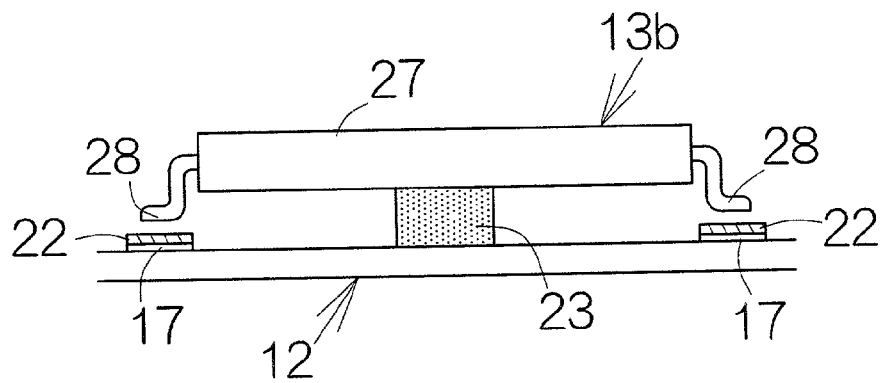
FIG. 9 is an enlarged partial section view of a printed wiring board for illustrating the process of placing a quad flat package (QFP) on the printed wiring board.

Otherwise, the aforementioned method may be employed to mount a quad flat package (QFP) 13b. As shown in FIG. 9, the terminal conductors or terminal leads 28 extend outward from the side surfaces of a package body 27 in the QFP 13b. The individual terminal leads 28 are received on the corresponding terminal pads 17 on the printed wiring board 12. As is apparent from FIG. 9, the solid support 23 may be employed to mount the QFP 13b on the printed wiring board 12 in the aforementioned manner. The solid support 23 may be located at the central area of the package body 27.

The solder particles in the solder paste 22 is allowed to melt on the terminal pads 17 prior to melting of the solid support 23. The organic solvent simultaneously gets vaporized. The melted solder is allowed to get exposed to the peripheral atmosphere over a larger area. Accordingly, the vaporized or gaseous organic solvent in the solder paste 22 is allowed to easily get out of the melted solder. Removal of the gas can be promoted in the melted solder.

The solid support 23 may be made of a thermoplastic resin material having a high heat conductivity. The thermoplastic resin of this type may comprise alumina ($Al_2O_3$) particles dispersed in a resin material. Employment of the thermoplastic resin material having a high heat conductivity leads to a promoted radiation of heat from the BGA semiconductor package 13, the full matrix BGA semiconductor package 13a, and the QFP 13b. As long as the solid support 23 after melting and solidification is prevented from contacting the connection terminals 16 and the terminal leads 28, the solid support 23 may have a property of electrically conductivity.

It should be noted that any types of terminal conductors, other than the aforementioned solder balls 19, may be employed in the BGA semiconductor package 13 and the full matrix BGA semiconductor package 13a.

What is claimed is:

1. A method of mounting an electronic component on a substrate, comprising:

placing the electronic component on the substrate with a solid support interposed between the electronic component and the substrate so as to space a terminal conductor of the electronic component from a corresponding terminal pad on the substrate;

melting a conductive bonding material on the terminal pad; and thereafter melting the solid support so as to move down the electronic component toward the substrate, thereby contacting the terminal conductor with the conductive bonding material melting on the corresponding terminal pad, wherein the electronic component drops toward the substrate based on its own weight in response to melting of the solid support.

2. The method according to claim 1, wherein said solid support is made of a thermoplastic resin material having a melting point higher than that of the conductive bonding material.

3. The method according to claim 1, wherein said conductive bonding material comprises solder particles dispersed in a flux including an organic solvent.

4. The method according to claim 1, wherein said solid support has an adherent property on its surface.

* * * * *